(12) United States Patent
Hennesthal et al.

(10) Patent No.: US 8,653,624 B2
(45) Date of Patent: Feb. 18, 2014

(54) SEMICONDUCTOR DEVICE COMPRISING METAL-BASED EFUSES OF ENHANCED PROGRAMMING EFFICIENCY BY ENHANCING METAL AGGLOMERATION AND/OR VOIDING

(71) Applicant: GLOBALFOUNDRIES Inc., Grand Cayman (KY)

(72) Inventors: Christian Hennesthal, Niederau (DE); Oliver Aubel, Dresden (DE); Jens Poppe, Radebeul (DE); Holger Pagel, Dresden (DE); Andreas Kurz, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/952,792

(22) Filed: Jul. 29, 2013

(65) Prior Publication Data
US 2013/0307114 A1 Nov. 21, 2013

Related U.S. Application Data

(62) Division of application No. 12/910,946, filed on Oct. 25, 2010.

(30) Foreign Application Priority Data

Dec. 31, 2009 (DE) .......................... 10 2009 055 439

(51) Int. Cl.
*H01L 23/52* (2006.01)
(52) U.S. Cl.
USPC .......................................... 257/529; 257/530
(58) Field of Classification Search
USPC ................................................ 257/529, 530
See application file for complete search history.

(56) References Cited

U.S. PATENT DOCUMENTS

| | | | |
|---|---|---|---|
| 5,420,456 A | 5/1995 | Galbi et al. | |
| 5,969,404 A | 10/1999 | Bohr et al. | |
| 6,355,969 B1* | 3/2002 | Skala et al. | 257/530 |
| 6,633,055 B2 | 10/2003 | Bertin et al. | |
| 2002/0005564 A1* | 1/2002 | Marr et al. | 257/529 |
| 2003/0109125 A1 | 6/2003 | Jou | |
| 2005/0189613 A1 | 9/2005 | Otsuka et al. | |
| 2007/0063348 A1 | 3/2007 | Yang et al. | |
| 2007/0210413 A1* | 9/2007 | Booth et al. | 257/529 |
| 2007/0252237 A1* | 11/2007 | Ko et al. | 257/529 |
| 2008/0186788 A1 | 8/2008 | Barth | |
| 2008/0217735 A1 | 9/2008 | Chen et al. | |
| 2008/0224261 A1 | 9/2008 | Hsu et al. | |
| 2009/0146251 A1* | 6/2009 | Ueda | 257/529 |
| 2009/0261450 A1* | 10/2009 | Cheng et al. | 257/529 |
| 2010/0032770 A1 | 2/2010 | Park et al. | |

OTHER PUBLICATIONS

Official Translation of Official Communication from German Patent Application No. 10 2009 055 439.4 dated Dec. 21, 2010.

* cited by examiner

*Primary Examiner* — Fernando L Toledo
*Assistant Examiner* — Karen Kusumakar
(74) *Attorney, Agent, or Firm* — Amerson Law Firm, PLLC

(57) ABSTRACT

Metal fuses in semiconductor devices may be formed on the basis of additional mechanisms for obtaining superior electromigration in the fuse bodies. To this end, the compressive stress caused by the current-induced metal diffusion may be restricted or reduced in the fuse body, for instance, by providing a stress buffer region and/or by providing a dedicated metal agglomeration region. The concept may be applied to the metallization system and may also be used in the device level, when fabricating the metal fuse in combination with high-k metal gate electrode structures.

18 Claims, 7 Drawing Sheets

SEMICONDUCTOR DEVICE COMPRISING METAL-BASED EFUSES OF ENHANCED PROGRAMMING EFFICIENCY BY ENHANCING METAL AGGLOMERATION AND/OR VOIDING

CROSS-REFERENCE TO RELATED APPLICATION

This is a divisional of co-pending application Ser. No. 12/910,946, filed Oct. 25, 2010, which claims priority to German Patent Application No. 10 2009 055 439.4, filed Dec. 31, 2009.

BACKGROUND OF THE INVENTION

1. Field of the Invention

The present disclosure generally relates to the field of fabricating integrated circuits, and, more particularly, to forming electronic fuses for providing device internal programming capabilities in complex integrated circuits.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are decreased with the introduction of every new circuit generation, to provide currently available integrated circuits with an improved degree of performance in terms of speed and/or power consumption. A reduction in size of transistors is an important aspect in steadily improving device performance of complex integrated circuits, such as CPUs. The reduction in size of the transistors is commonly associated with an increased switching speed, thereby enhancing signal processing performance. In addition to the large number of transistor elements, a plurality of passive circuit elements, such as capacitors, resistors and the like, are typically formed in integrated circuits that are used for a plurality of purposes, such as for decoupling.

Due to the reduced dimensions of circuit elements, not only the performance of the individual transistor elements may be increased, but also their packing density may be improved, thereby providing the potential for incorporating increased functionality into a given chip area. For this reason, highly complex circuits have been developed which may include different types of circuits, such as analog circuits, digital circuits and the like, thereby providing entire systems on a single chip (SoC). Furthermore, in sophisticated micro-controller devices, an increasing amount of storage capacity may be provided on chip with the CPU core, thereby also significantly enhancing the overall performance of modern computer devices.

In modern integrated circuits, minimal features sizes have now reached approximately 50 nm and less, thereby providing the possibility of incorporating various functional circuit portions at a given chip area, wherein, however, the various circuit portions may have a significantly different performance, for instance with respect to lifetime, reliability and the like. For example, the operating speed of a digital circuit portion, such as a CPU core and the like, may depend on the configuration of the individual transistor elements and also on the characteristics of the metallization system, which may include a plurality of stacked metallization layers so as to comply with a required complex circuit layout. Thus, highly sophisticated manufacturing techniques may be required in order to provide the minimum critical feature sizes of the speed critical circuit components. For example, sophisticated digital circuitry may be used on the basis of field effect transistors, which represent circuit components in which conductivity of a channel region is controlled on the basis of a gate electrode that is separated from the channel region by a thin dielectric material. Performance of the individual field effect transistors is determined by, among other things, the capability of the transistor to switch from a high impedance state into a low impedance state at high speeds, wherein a sufficiently high current may also be driven in the low impedance state. This drive current capability is determined by, among other things, the length of the conductive channel that forms in the channel region upon application of an appropriate control voltage to the gate electrode. For this reason, and in view of the increasing overall packing density of sophisticated semiconductor devices, the channel length, and thus the length, of the gate electrode is continuously being reduced, which, in turn, may require an appropriate adaptation of the capacitive coupling of the gate electrode to the channel region. Consequently, the thickness of the gate dielectric material may also have to be reduced in order to maintain controllability of the conductive channel at a desired high level. However, the shrinkage of the gate dielectric thickness may be associated with an exponential increase of the leakage currents, which may directly tunnel through the thin gate dielectric material, thereby contributing to enhanced power consumption and thus waste heat, which may contribute to sophisticated conditions during operation of the semiconductor device. Moreover, charge carriers may be injected into the gate dielectric material and may also contribute to a significant degradation of transistor characteristics, such as threshold voltage of the transistors, thereby also contributing to variability of the transistor characteristics over the lifetime of the product. Consequently, reliability and performance of certain sophisticated circuit portions may be determined by material characteristics and process techniques for forming highly sophisticated circuit elements, while other circuit portions may include less critical devices which may thus provide a different behavior over the lifetime compared to critical circuit portions. Consequently, the combination of the various circuit portions in a single semiconductor device may result in a significant different behavior with respect to performance and reliability, wherein, also, the variations of the overall manufacturing process flow may contribute to a further discrepancy between the various circuit portions. For these reasons, in complex integrated circuits, frequently, additional mechanisms may be implemented so as to allow the circuit itself to adapt performance of certain circuit portions to comply with the performance of other circuit portions, for instance after completing the manufacturing process and/or during use of the semiconductor device, for instance when certain critical circuit portions may no longer comply with corresponding performance criteria, thereby requiring an adaptation of certain circuit portions, such as re-adjusting an internal voltage supply, re-adjusting the overall circuit speed and the like.

For this purpose, so-called electronic fuses or e-fuses may be provided in the semiconductor devices, which may represent electronic switches that may be activated once in order to provide a desired circuit adaptation. Hence, the electronic fuses may be considered as having a high impedance state, which may typically also represent a "programmed" state, and may have a low impedance state, typically representing a non-programmed state of the electronic fuse. Since these electronic fuses may have a significant influence on the overall behavior of the entire integrated circuit, a reliable detection of the non-programmed and the programmed state may have to be guaranteed, which may have to be accomplished on the basis of appropriately designed logic circuitry. Furthermore, since typically these electronic fuses may be actuated only once over the lifetime of the semiconductor device under consideration, a corresponding programming activity may have to ensure that a desired programmed state of the electronic fuse is reliably generated in order to provide well-defined conditions for the further operational lifetime of the device. With the continuous shrinkage of critical device dimensions in sophisticated semiconductor devices, however, the reliability of the programming of corresponding electronic fuses may require tightly set margins for the corresponding voltages and currents used to program the electronic fuses, which may not be compatible with the overall specifications of the semiconductor devices or may at least have a severe influence on the flexibility of operating the device.

In conventional strategies, the fuses are formed on the basis of a semiconductor material, such as polysilicon and the like, as may typically also be used for forming conductive lines in the device level of the semiconductor device, for instance for gate electrode structures of field effect transistors, wherein the per se negative effect of electromigration, in combination with a charge carrier depletion in the semiconductor material, may be taken advantage of in order to initiate a significant deterioration of the electronic fuse by applying a current for programming the fuse into a high impedance state. As is well known, electromigration is a phenomenon in which a high current density in DC operated conductive lines may result in a "diffusion" of metal atoms caused by the momentum transfer of the high density electron flow. In polysilicon lines, typically, a metal silicide material is provided to enhance the conductivity of the semiconductor-based material and a pronounced electromigration effect may, thus, intentionally be initiated in the metal silicide material, thereby increasingly contributing to a metal depletion at the cathode, while a material agglomeration is observed towards the anode. Furthermore, the electromigration effect may further be increased by locally creating elevated temperatures, which may be accomplished by locally providing a desired high resistance for a given total current that is to be driven through the electronic fuse. Consequently, appropriate lateral dimensions for fuse bodies, i.e., the portions of the electronic fuses in which an electromigration effect and, thus, the line degradation is to be initiated, are provided for a given material composition and thickness of the electronic fuses, in accordance with the overall process strategy for forming the sophisticated gate electrode structures of the field effect transistors. For example, the cross-sectional area of the fuse bodies may be reduced by selecting a minimum width of the fuse bodies, while at the same time the length of the fuse bodies may be increased, thereby increasing the overall electromigration effect.

Due to the increasing overall complexity of semiconductor devices, however, an increased number of electronic fuses has to be provided, which, however, may result in a significant consumption of valuable chip area in the device level of the semiconductor devices. Furthermore, recently, very complex gate electrode structures are being implemented in sophisticated semiconductor devices in order to enhance transistor performance, wherein the conventional gate materials, such as silicon dioxide as a gate dielectric and polysilicon in combination with a metal silicide as an electrode material, are replaced by a high-k dielectric material in combination with an electrode metal, such as aluminum and the like. As a consequence, materials of improved conductivity may be implemented in the fuse bodies, unless additional significant efforts have to be made so as to locally provide the conventional polysilicon/metal silicide material system for the electronic fuses. Thus, the incorporation of highly conductive metals, such as aluminum and the like, in the device level and the demand for further increasing the overall packing density in semiconductor devices have recently resulted in the concept of providing electrically programmable fuses on the basis of metals, thereby also considering the possibility of implementing "three-dimensional" fuses, which may, thus, be provided in the metallization system of the semiconductor device.

In complex semiconductor devices, typically, metallization systems, i.e., a plurality of stacked metallization levels, are provided, in which metal lines provide the inner-level electrical connection, while so-called vias, i.e., "vertical" interconnect structures, may provide the intra-level connection, thereby providing the complex interconnect network in order to electrically connect the individual circuit elements provided in the device level according to the required circuit layout. The metal lines and vias typically comprise a highly conductive metal, such as aluminum, or, in very complex integrated circuits, copper, which may exhibit a reduced electromigration effect and an overall higher conductivity compared to aluminum. Due to copper's characteristic to readily diffuse in a plurality of well-established dielectric materials, such as silicon dioxide and silicon dioxide-based low-k dielectric materials, which are typically used in combination with copper material in order to reduce signal propagation delay caused by the parasitic capacitance in the metallization system, a conductive barrier material, such as tantalum, tantalum nitride and the like, is to be formed in the metal lines and vias.

Since reliability and lifetime of complex semiconductor devices may essentially be determined by the duration of metallization systems, significant efforts are being made in investigating line degradation in metallization systems caused by electromigration, since a complex interaction between dielectric materials, the highly conductive core material, such as copper, and the geometry of conductive parts may have to be taken into consideration in order to quantitatively estimate the overall performance and degradation over lifetime.

With reference to FIGS. 1a-1c, a typical electromigration mechanism may be explained in a metal-based interconnect system of a semiconductor device.

FIG. 1a schematically illustrates a cross-sectional view of a semiconductor device 100 comprising a substrate 101, i.e., any appropriate carrier material, such as a semiconductor substrate and the like. Moreover, a device level 110, which may be understood as a semiconductor layer, in and above which a plurality of semiconductor-based circuit elements, such as transistors, resistors and the like, are provided, may be formed above the substrate 101 and may have incorporated therein a plurality of circuit elements, which are schematically indicated by 111. Moreover, a metallization system 150 is provided above the device level 110 and typically comprises a plurality of metallization layers, wherein, for convenience, two metallization layers 160 and 170 are illustrated. The metallization layer 160 typically comprises a dielectric material 161, such as a low-k dielectric material in the form of silicon dioxide-based materials having a reduced density, thereby obtaining a reduced dielectric constant of 3.0 and less. In other cases, any other appropriate dielectric materials, such as polymer materials and the like, may be used as the dielectric material 161. Moreover, the metallization layer 160 comprises a plurality of metal lines, wherein, for convenience, a single metal line 163 is illustrated. As discussed above, the metal line 163 comprises a highly conductive metal 163A, such as aluminum, and, in sophisticated applications, copper, in which case, a conductive barrier material 163B is also required, which may, thus, substantially suppress diffusion of copper into the dielectric material 161 and, which may also suppress the incorporation of reactive atomic species, such as fluorine, oxygen and the like, into the highly conductive core metal 163A. Moreover, the metallization layer 160 may comprise an etch stop material 162, which, in some cases, may also act as a diffusion blocking layer for confining the material 163A of the metal line 163. For example, silicon nitride-based materials or silicon oxide-based materials may be used.

The metallization layer 170 comprises a dielectric material 171, a metal line 173L in combination with a via 173V, which comprise a highly conductive metal 173A, possibly in combination with a conductive barrier material 173B. Furthermore, a cap layer or etch stop layer 172 is formed on the dielectric material 171 and may, depending on the overall process strategy, act as a confinement cap layer for the metal line 173L. Basically, the same materials may be used in the metallization layer 170 for the various components as is also described for the metallization layer 160.

Upon operating the device 100, a current flow may be established in the flow path, a portion of which is represented by the metal line 163, the via 173V and the metal line 173L. For example, it may be assumed that the electron flow is directed from the metal line 163 to the metal line 173L. As previously explained, electromigration is a highly complex dynamic process, in which the momentum exchange between charge carriers, that is, electrons, and metal atoms may result in a collective migration of the metal atoms when a sufficiently high current density is achieved. Due to the reduced cross-sectional areas of the metal lines 163, 173L and the via 173V in sophisticated integrated circuits, and due to the fact that, in principle, the metal lines are confined in a respective dielectric material allowing a very efficient heat transfer into the surrounding chip area, extremely high current densities of approximately $10^6$ ampere per cm$^2$ may be achieved, thereby resulting in significant electromigration effects. Thus, unless the metallization structure of a semiconductor device is designed and manufactured in such a way that such high current densities may be reliably avoided in any metal region of the semiconductor device, electromigration will occur during the operation of the semiconductor device 100. It should be appreciated that a design of semiconductor devices, in which any such high current densities may be avoided, would significantly reduce the design flexibility and would require a reduced packing density, thereby also reducing performance and cost efficiency of any such semiconductor devices. Consequently, typically, a compromise is made between performance and packing density with respect to electromigration in that, instead of manufacturing substantially "immortal" metallization structures, design and manufacturing criteria are selected such that a desired lifetime under specific operation conditions is achieved. Certain theoretical models of the electromigration phenomenon have been established, for instance known under Black's Law, which indicate a relationship between a typical time to failure and the square of the inverse current density and which quantitatively describes the effect of electromigration for a certain class of conditions with moderate precision. Moreover, other effects, such as the Blech effect, have been discovered, which allows completely avoiding electromigration effects, when the length of a metal region at a specific current density is selected to be equal or less than a critical length.

Consequently, based on theoretical models and appropriately designed test structures, critical portions in the metallization system may be determined and the time to failure may be estimated. That is, due to the diffusion in the metal lines and vias, voids may be formed in one area of the metal line, thereby continuously increasing the overall resistivity, which may, thus, contribute to an even further increased current density, which may finally result in a complete failure of the corresponding interconnect structure.

FIG. 1b schematically illustrates an electromigration effect in the metallization system 150. For example, it may be assumed that the barrier layer 163B at the bottom of the via 173V may represent a strong barrier, thereby suppressing any metal diffusion from the line 163 into the via 173V. In this case, upon establishing the current flow, as indicated, electromigration may occur in the via 173V and the metal line 173L, wherein, increasingly, the metal, for instance copper, may be transported along the current flow direction. However, the diffused metal has to be accumulated within the metal lines if a corresponding strong barrier is present, thereby increasing and densifying the material in the metal lines, which may, thus, result in an increasing compressive stress. For example, a corresponding "enrichment" with additional metal material in the downstream direction may result in a consumption of grain boundaries 174G, thereby increasing the average size of the metal grains in the downstream direction, while increasingly causing a material depletion in the upstream direction.

FIG. 1c schematically illustrates the situation after a significant amount of metal material has been transported along the via 173V and the metal line 173L, thereby resulting in a reduced number of grain boundaries 174G and, thus, in a reduced number of metal grains, while at the same time a certain degree of voiding, indicated by a void 175, has occurred.

Consequently, upon designing metal fuses, the per se negative effect of electromigration may be used in order to cause a permanent line degradation in a corresponding metal fuse by intentionally providing a portion or fuse body subjected to increased electromigration, which, for instance, may be accomplished, according to Blech's Law, on the basis of a sufficient length for a given available current density, which in turn may be determined by a cross-sectional area of the metal line portion and the available programming voltage and current. Due to the high conductivity of the metal lines, however, high currents and/or an increased length of the fuse body may be required, thereby reducing the "packing density" of corresponding metal fuses in the metallization system of complex semiconductor devices.

The present disclosure is directed to various devices and methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides electrically programmable metal fuses in a semiconductor device, wherein the programming efficiency, i.e., a required high reliability of causing and preserving a programmed state of the metal fuse, may be enhanced, while at the same time an overall compact configuration may be achieved. To this end, the present disclosure considers the incorporation of efficient stress-reducing mechanisms for reliably inducing an electromigration effect, i.e., a significant migration or diffusion of metal atoms and ions in the fuse body, while the overall dimensions, and in particular the effective length, of the fuse body may be reduced compared to conventional approaches in which, for a given cross-sectional area and material composition of a metal line, the length thereof may be increased to be well above the Blech length, which, however, may result in a considerable consumption of valuable chip area. A significant reduction of the overall dimensions, and in particular of the length, of a fuse body may be accomplished by reducing the compressive stress that is created upon initiating an electromigration effect, thereby facilitating the creation of voids in the fuse body, and, thus, causing a significant line degradation, which may, therefore, be reliably identified as a programmed state of the metal fuse. The reduction of the compressive stress in the metal fuse, which may, thus, enable a superior metal accumulation, may be achieved on the basis of "passive" and/or "active" mechanisms. For instance, a passive stress reduction or limitation mechanism may be provided in the form of stress buffer regions or reservoirs that are efficiently mechanically coupled to the fuse body, in which a material depletion is to be initiated. In other cases, the compressive stress-reducing mechanism may be established in addition to or alternatively to a passive mechanism by intentionally providing a metal accumulation volume or region at the time of programming the fuse, wherein the diffusing metal may actually leave the fuse body and may migrate into the surrounding dielectric material or into specifically provided metal accumulation voids. Consequently, by actively initiating the extrusion of the migrating metal from the fuse body, superior conditions with respect to maintaining an efficient line degradation effect also may be achieved at the time of programming the fuse, due to significantly reduced resulting compressive stress in the fuse body, thereby reliably activating a programmed state, while at the same time a re-diffusion of metal may be significantly reduced. In some illustrative aspects disclosed herein, the activation of the extrusion mechanism may be accomplished by providing an extrusion line or region in close proximity to the fuse body, thereby facilitating an electrical breakdown of the insulating material, which in turn may result in the weakening of a corresponding interface between the fuse body and the dielectric material. Consequently, an efficient diffusion path for the migrating metal atoms may be generated in a highly controllable manner, thereby also enabling a very compact overall configuration of the metal fuse.

One illustrative semiconductor device disclosed herein comprises an electrically programmable fuse comprising a fuse body comprising a metal, wherein the fuse body is configured to enable current-induced metal diffusion upon establishing a programming current in a current flow path of the fuse body. The fuse further comprises contact regions connecting to the fuse body. Moreover, a stress buffer region is provided in direct mechanical contact with the fuse body so as to enable stress transfer from the fuse body into the stress buffer region, wherein the stress buffer region is configured so as to substantially avoid generation of compressive stress within the stress buffer region during the current-induced metal diffusion.

A further illustrative semiconductor device disclosed herein comprises an electrically programmable fuse. The fuse comprises a fuse body comprising a metal and having a metal extrusion portion. Moreover, contact regions are provided so as to connect to the fuse body. The fuse further comprises a metal accumulation region positioned adjacent to the metal extrusion portion, wherein the metal accumulation region is configured to receive metal from the metal extrusion portion upon establishing a current flow in the fuse body. Moreover, the fuse comprises a dielectric material enclosing at least a portion of the fuse body.

One illustrative method disclosed herein relates to electrically programming a fuse in a semiconductor device. The method comprises establishing a current flow in a fuse body of the fuse to initiate a current-induced metal diffusion. The method further comprises reducing a compressive stress in the fuse body, wherein the compressive stress is caused by the current-induced metal diffusion.

BRIEF DESCRIPTION OF THE DRAWINGS

The disclosure may be understood by reference to the following description taken in conjunction with the accompanying drawings, in which like reference numerals identify like elements, and in which:

FIG. 2b schematically illustrates a cross-sectional view of the metal fuse of FIG. 2a;

Figure 1A:
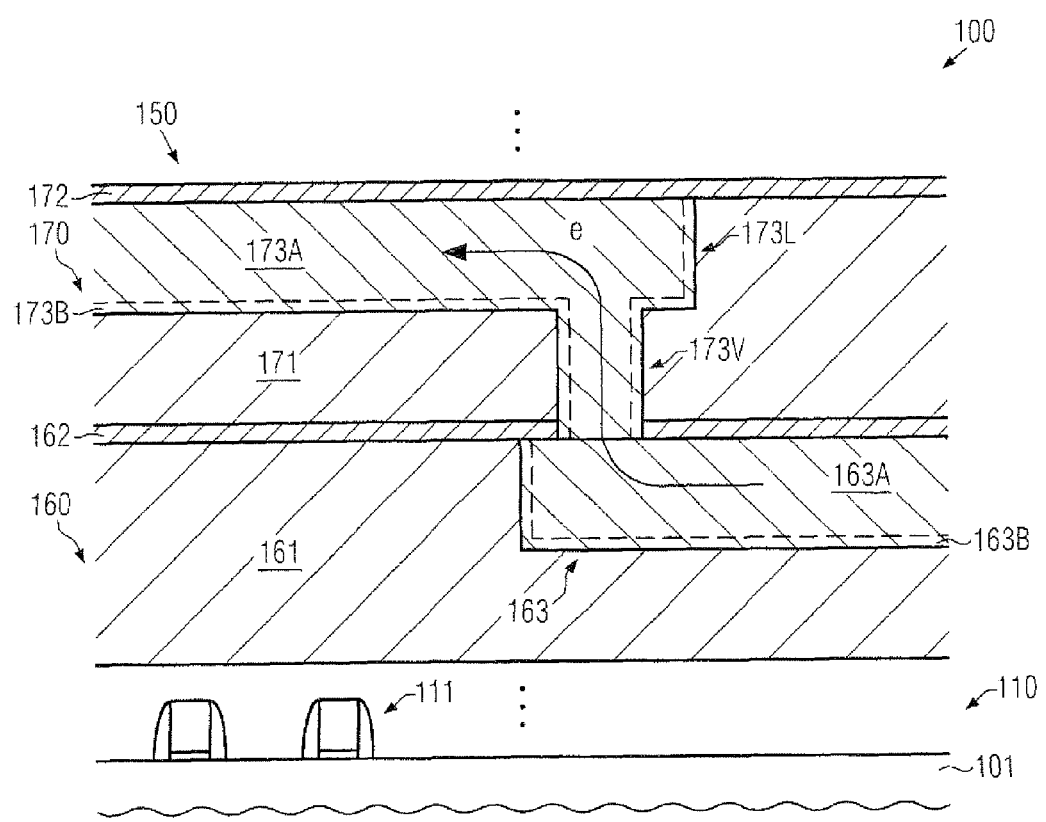
FIG. 1a schematically illustrates a cross-sectional view of a metallization system in a conventional semiconductor device, wherein electromigration may occur in at least a portion of a current flow path.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices including metal-based electrically programmable fuses and also provides methods for operating these fuses, thereby achieving superior reliability in generating a programmed state and preserving the state with a high degree of detectability over the lifetime of the semiconductor device. To this end, the electromigration effect in the fuse body of the metal fuses may be increased by providing, in addition to well-known electromigration causing mechanisms, such as providing a length that is greater than the corresponding Blech length, weakening specific interfaces, which may have been recognized as major diffusion paths for the current-induced metal diffusion, and the like, an additional very efficient mechanism in order to enable a reduction in overall size of the metal fuses, while, nevertheless providing superior reliability. In this respect, reliability may be understood as a reliable transition of the metal fuse from a low impedance state into a high impedance state accomplished by using supply voltages and, thus, currents that may be reliably available during the lifetime of the semiconductor device under consideration and/or upon setting the configuration of a semiconductor device. According to the principles disclosed herein, the current- and heat-induced metal diffusion in the fuse body may be enhanced by reducing the resulting compressive stress in the fuse body, thereby efficiently maintaining the depletion of the metal material during the programming process when applying the programming current pulse, which in turn reliably generates a significant line deterioration that is detectable by any appropriate control circuitry connected to the metal fuse. Thus, upon initiating metal diffusion in the fuse body, the accumulation or agglomeration of the metal material in the downstream direction may occur under less pronounced compressive stress conditions compared to conventional metal fuses, thereby effectively reducing the Blech length, which indicates the length above which electromigration occurs. Consequently, a reduced effective length of the fuse body may be used, thereby contributing to an increased packing density for incorporating a plurality of metal fuses into a complex semiconductor device. The efficient reduction or limitation of the compressive stress that may build up upon programming the metal fuse may be accomplished, according to some illustrative embodiments, by providing a stress buffer region, which may, in some illustrative embodiments, represent a portion of the metal fuse, in which metal migration may be substantially avoided, while, at the same time, the compressive stress may be efficiently coupled from the fuse body into the stress buffer region, which may then efficiently "distribute" the resulting compressive stress. In some illustrative embodiments, the stress buffer region has an increased cross-sectional metal area compared to the actual fuse body, in which a pronounced metal voiding is desired, for instance, by providing an increased width for an otherwise given configuration of the metal system, wherein the stress buffer region may be positioned within the current flow path, while, in other cases, the stress buffer region may be efficiently coupled to the fuse body with respect to stress transfer, while the current flow path may not extend through the stress buffer region. Consequently, irrespective of the position of the stress buffer region, i.e., within the current flow path or outside the current flow path, the stress buffer region does not essentially contribute to additional compressive stress that is caused by current flow in the fuse body, while, at the same time, the stress buffer region efficiently increases the volume in which the compressive stress generated in the fuse body may be distributed. Consequently, the volume for accepting the compressive stress component generated in the fuse body may be efficiently increased, while, at the same time, the required chip area for providing the metal fuse may be reduced, for instance due to the significantly reduced length required for a given current and voltage applied during the program current pulse.

In other embodiments, the stress buffer region may comprise, in addition or alternatively to a metal volume that is directly connected to the metal of the fuse body, a tensile stressed material, such as a dielectric material that is positioned adjacent to the fuse body.

According to further illustrative embodiments, the compressive stress resulting from current-induced metal diffusion may be reduced or may be restricted by providing an efficient metal accumulation region that is positioned adjacent to a metal extrusion portion provided in the fuse body. In this manner, the agglomeration of the diffusing metal species may be controlled by providing a dedicated extrusion point in the fuse body. In some illustrative embodiments, the extrusion portion may be formed on the basis of locally reducing the strength of a barrier material or generally of an interface formed between a dielectric material and the metal fuse body, wherein, if desired, an additional volume or void may be provided so as to even further enhance the metal agglomeration therein. In other illustrative embodiments disclosed herein, the metal extrusion may be actively initiated, for instance, by inducing a dielectric breakdown of a dielectric material, which may be caused on the basis of an additional "extrusion region" via which an appropriate potential may be applied across the dielectric material between the extrusion portion of the fuse body and the extrusion region. Thus, upon inducing the current-induced metal diffusion in the fuse body, the extrusion portion may represent the "weakest" location in the fuse body, thereby initiating the material diffusion from the extrusion portion into the adjacent dielectric material and also efficiently reducing the resulting compressive stress in the fuse body, which in turn may further promote the deterioration of the fuse body in view of its electrical conductivity.

In some illustrative embodiments, the fuse body may be configured so as to comprise two closely spaced metal regions, wherein, upon initiating an initial metal extrusion, one of the metal regions may then act as an extrusion region, thereby obtaining a "self-enhancing" extrusion behavior, which may finally result in a superior material diffusion and, thus, an enhanced electromigration effect.

It should be appreciated that the present disclosure may be advantageously applied to semiconductor devices in which efficient metal fuses with reduced volume may be implemented into the metallization system, wherein the additional electromigration enhancing effects based on compressive stress reduction or limitation may provide superior packing density and reliability of the metal fuses. In other illustrative embodiments, the metal fuses may also be efficiently provided in a "two-dimensional" configuration, for instance within the device level of sophisticated semiconductor devices, in which the gate electrode structures may be formed on the basis of highly conductive metals, such as aluminum and the like. Hence, efficient metal fuses may be implemented into the complex manufacturing sequence for forming high-k metal gate electrode structures, however, without unduly consuming valuable chip area, as may be the case in conventional strategies.

Figure 1B:
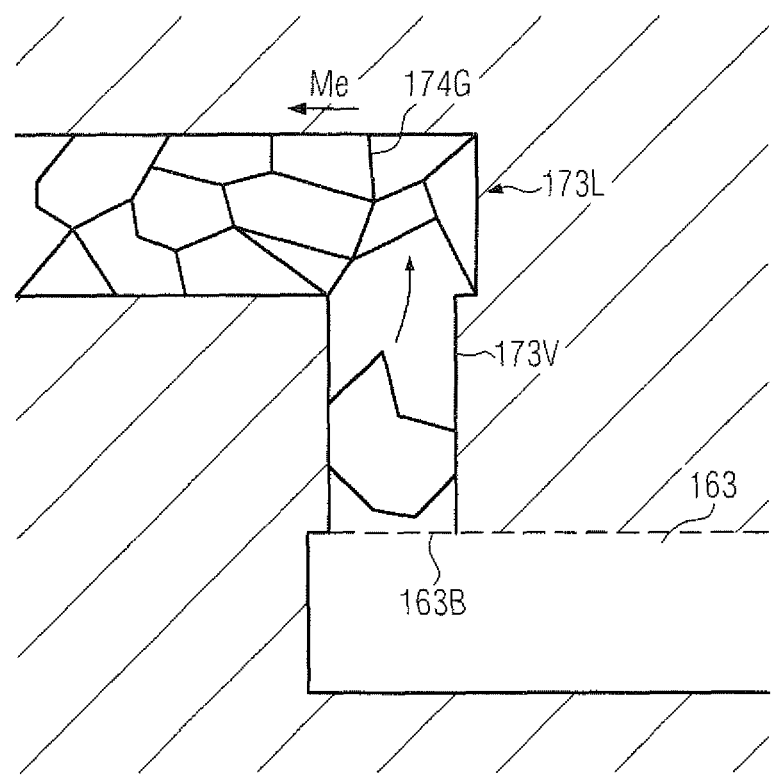
FIGS. 1b-1c schematically illustrate a portion of the current flow path, wherein metal depletion and metal agglomeration may occur, thereby creating compressive stress due to reducing the number of grain boundaries, and, thus, increasing the size of the metal grains in the current flow path.
Figure 1C:
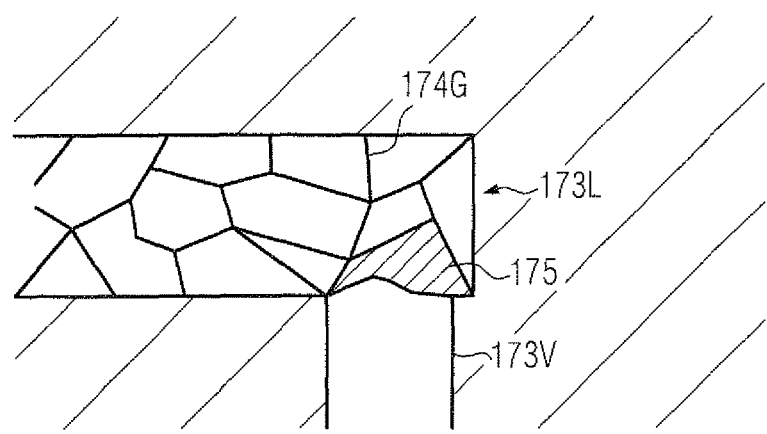

With reference to FIGS. 2a-2l, further illustrative embodiments will now be described in more detail, wherein reference may also be made to FIGS. 1a-1c, if required.

Figure 2A:
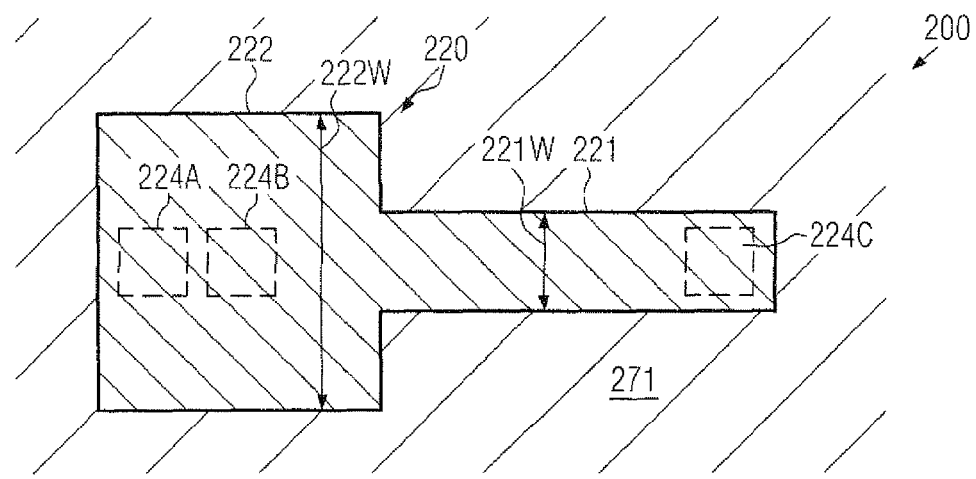
FIG. 2a schematically illustrates a top view of a metal fuse according to one illustrative embodiment, wherein a stress buffer region is in mechanical direct contact with a fuse body in order to reduce the compressive stress and, thus, promote electromigration and, hence, metal depletion in some areas of the fuse body.

FIG. 2a schematically illustrates a top view of a semiconductor device comprising a metal-based electrically programmable fuse 220, which may be provided in any appropriate level within the semiconductor device 200, for instance within a metallization system or within the semiconductor layer, as explained above. As illustrated, the metal fuse 220 may comprise a fuse body 221, which is to be understood as any appropriate metal-containing region having a cross-sectional area and a length for initiating a significant current-induced metal diffusion, wherein, as previously explained, in particular for a given cross-sectional area, the length may be reduced compared to conventional approaches, since the resulting compressive stress in the fuse body 221 may be efficiently reduced, for instance, by a stress buffer region 222 and/or by providing a mechanism for initiating metal extrusion, as will be described later on in more detail. For example, the fuse body 221 may be comprised of aluminum, copper and the like, possibly in combination with any conductive barrier materials as may be required for appropriately confining a highly conductive metal, such as copper, with respect to a surrounding dielectric material 271. Furthermore, in the embodiment shown, the fuse body 221 may be in direct mechanical and electrical contact with the stress buffer region 222, which may, thus, represent an electrical contact area for the fuse body 221, while a further contact area or contact element 224C may electrically connect the fuse body 221 to any appropriate voltage and current source. As illustrated, the stress buffer region 222 may have an increased width 222W compared to a width 221W of the fuse body, thereby providing a large volume for accommodating a compressive stress component induced in the fuse body 221. Also, a current flowing through the stress buffer region 222 may not result in an additional compressive stress component, since current-induced metal diffusion may not occur in the region 222 due to the significantly increased cross-sectional area compared to the fuse body 221. Moreover, contact elements 224A, 224B may be provided so as to connect the stress buffer region 222 to any appropriate current and voltage source, wherein any current-induced metal diffusion may be suppressed by providing an appropriate effective cross-sectional area for connecting the region 222 with the current and voltage source, which may be accomplished by providing a plurality of the contact elements 224A, 224B or by providing these elements with increased cross-sectional area.

Figure 2B:
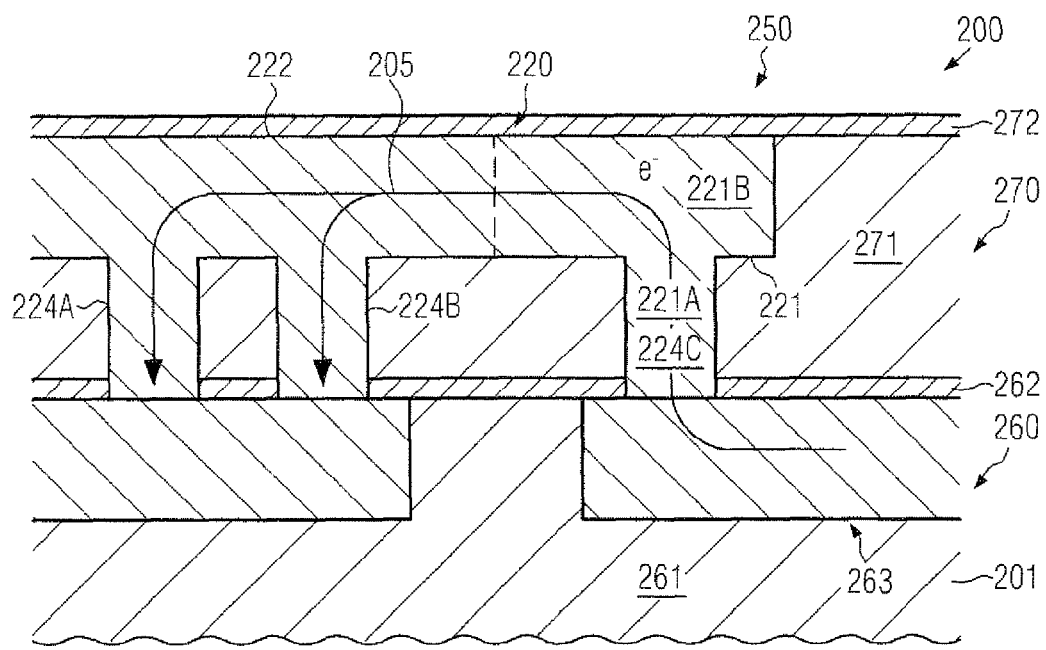

FIG. 2b schematically illustrates a cross-sectional view of the device 200 of FIG. 2a. As illustrated, the device 200 may comprise a substrate 201, such as any appropriate carrier material, as previously also discussed with reference to the device 100. Furthermore, a metallization system 250 may be formed above the substrate 201 and may comprise a plurality of metallization layers, such as a metallization layer 260 and a metallization layer 270. It should be appreciated that, above the metallization layer 270 and below the metallization layer 260, one or more further metallization layers may be provided, depending on the overall complexity of the device 200.

In the embodiment shown, the metal fuse 220 may, thus, be provided within the metallization system 250. For this purpose, the metallization layer 260 may comprise metal lines 263, embedded in a dielectric material 261, wherein the metal lines 263 and the dielectric material 261 may have any appropriate configuration as also required for other interconnect structures in the metallization layer 260, as is previously discussed with reference to the semiconductor device 100. It should be appreciated that the metal lines 263 may comprise any appropriate metal, such as aluminum, copper and the like, in combination with any conductive barrier materials (not shown), if required. For example, conductive barrier materials may be provided, as discussed above with reference to the metallization system 150. Furthermore, the layer 260 may comprise a dielectric cap layer or etch stop layer 262, followed by a dielectric material 271 of the metallization layer 270. The metallization layer 270 may comprise the fuse body 221 having any appropriate configuration, with respect to material composition and the like, as any other metal region or line in the metallization layer 270. In the embodiment shown, the fuse body 221 may represent "a three-dimensional component," since a contact element or via 224C may additionally act as a portion 221A of the fuse body, i.e., in the portion 221A, the resulting current density established upon initiating a current flow along a current flow path 205 may result in current-induced metal diffusion, as explained above. Furthermore, the fuse body 221 may comprise a portion 221B which may be considered as a corresponding line portion, which may also have an appropriate cross-sectional area that may cause current-induced metal diffusion. Consequently, the portion 221A may act as a metal depletion region of the fuse body and as a contact area and may, thus, connect to one of the metal lines 263. It should be appreciated that the lines 263 may have any appropriate configuration so as to substantially avoid any current-induced metal diffusion therein. Furthermore, in some cases, the via or body portion 221A may have formed on a bottom thereof a conductive barrier material, which may also act as an efficient barrier for suppressing any metal diffusion from the metal line 263 into the portion 221A. Moreover, the metal fuse 220 may comprise the stress buffer region 222, which in turn may be connected to one of the metal lines 263 on the basis of the vias 224A, 224B, which in combination reduce the current density therein, thereby avoiding any unwanted current-induced metal diffusion. Hence, the stress buffer region 222 and the fuse body 221 are in direct mechanical and electrical contact, since these regions may represent a common metal region, however, with a different current density upon establishing a current flow along a current flow path 205.

The semiconductor device 200 as shown in FIGS. 2a and 2b may be formed on the basis of any appropriate process technique, based on which any other interconnect structures may be formed in the metallization layers 260, 270. For example, the dielectric material of a corresponding metallization layer may be deposited on the basis of any appropriate process technique and subsequently the dielectric material may be patterned so as to form openings and trenches therein, which may subsequently be filled with a conductive barrier material, if required, in combination with the actual core metal, such as copper and the like. Upon patterning the dielectric material, such as the material 271, appropriate lateral dimensions of the electronic fuse 220 may be accomplished on the basis of appropriately designed lithography masks. It should be appreciated that the specific lateral dimension may be selected in accordance with the overall design rules of the device 200, thereby also taking into consideration the corresponding technology to be used for forming the device 200. For example, in sophisticated semiconductor devices, the lateral dimensions, such as the width 221W of the fuse body 221, may be 100 nm and even less, while the width 222W may be 150 nm and greater, wherein appropriate dimensions may be readily determined on the basis of experiments. As previously discussed, typically, the electromigration performance of the metallization systems may be continuously monitored in order to estimate lifetime and reliability of corresponding metallization systems and to identify "degradation" mechanisms. Based on any such experimental data, in combination with theoretical models, appropriate design dimensions may be determined for the fuse body 221 and the stress buffer region 222 in order to obtain a desired current-induced metal diffusion, wherein, in particular, the overall length of the electronic fuse 220 may be less compared to metal fuses, in which a reliable electromigration effect may have to be provided on the basis of a width 221W without being connected to a stress buffer region.

After filling in appropriate metals, the processing may be continued by removing any excess material and forming a cap layer or etch stop layer, such as the layers 262 and 272, thereby completing the manufacturing process for forming one of the metallization layers 260, 270.

Upon operating the semiconductor device 200, a current pulse with a duration of several microseconds or tenths of microseconds may be applied by activating a corresponding voltage source (not shown), which may finally be connected to the metal lines 263. Depending on the supply voltage and the overall series resistance of the current flow path 205, which may essentially be determined by the resistivity of the fuse body 221, a current may be established, which may result in a current density within the portion 221 that results in current-induced electromigration in the fuse body 221. It should be appreciated that, additionally, the reduced conductivity of the fuse body 221 may also result in a local heating, which may in turn further promote the electromigration effect in the fuse body 221. According to the mechanism previously explained with reference to FIGS. 1b and 1c, material originating in the fuse body 221 may accordingly be redistributed so as to be increasingly accumulated downstream with respect to the current flow path 205, which may, thus, result in a metal depletion, for instance at the bottom of the portion 221A, while an increased material density may be generated, for instance adjacent to the stress buffer region 222. Due to the direct coupling of the regions 221 and 222, a certain amount of material may also be incorporated into the region 222 and, in particular, the compressive stress may be efficiently transferred into the region 222, thereby also effectively reducing the prevailing compressive stress in the fuse body 221. Consequently, the depletion of metal in the fuse body 221 may advance more efficiently, thereby reliably deteriorating the conductivity of the fuse body 221 by increasingly creating a depletion area, for instance in the portion 221A, which may in turn result in a reliably detectable high-impedance state, as is desired.

Figure 2C:
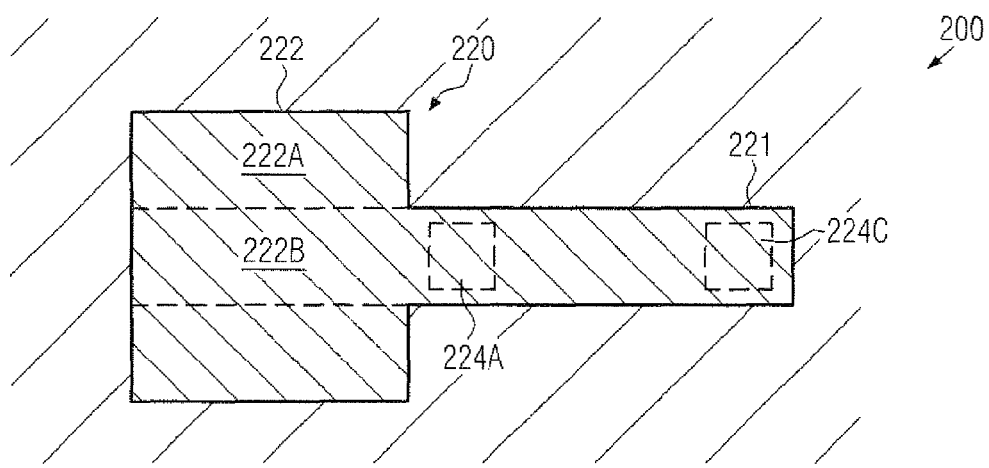
FIGS. 2c-2d schematically illustrate a top view and a cross-sectional view, respectively, of a metal fuse comprising a stress buffer region outside of the current flow path, according to further illustrative embodiments.
Figure 2D:
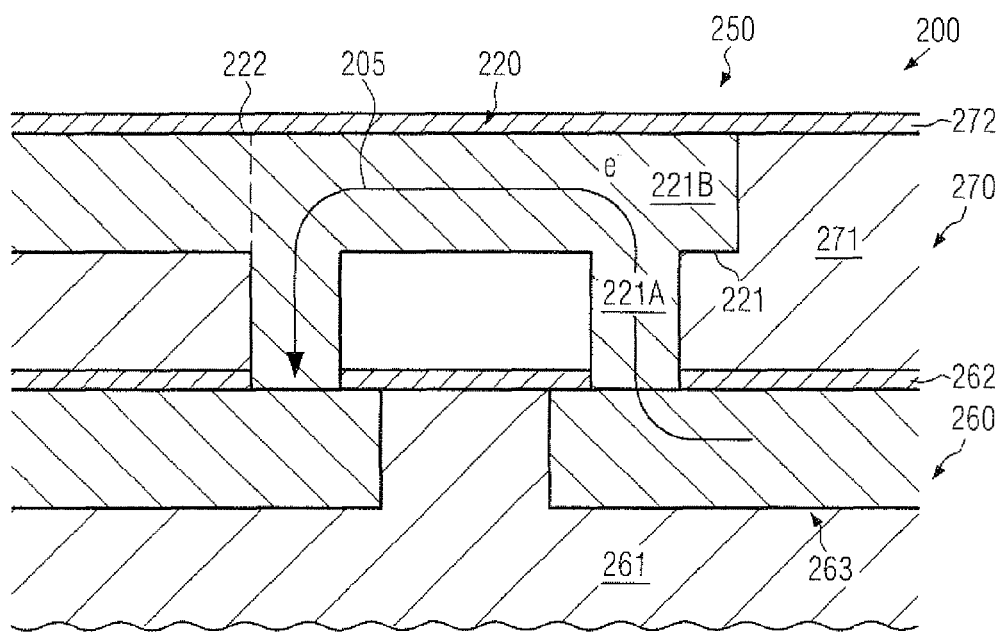

FIGS. 2c and 2d schematically illustrate a top view and a cross-sectional view, respectively, of the metal fuse 220, wherein the stress buffer region 222 may be positioned outside the current flow path.

FIG. 2c illustrates the metal fuse 220 with the fuse body 221, mechanically directly connected to the stress buffer region 222, while the current flow path may be determined by the contact elements 224A, 224C. Moreover, in one illustrative embodiment, the stress buffer region 222 may have an increased width, as indicated by the combination of a portion 222A and 222B, while, in other embodiments, the portion 222A may be omitted and, thus, the portion 222B may represent a mechanical extension of the fuse body 221 in view of stress reduction, while, however, not contributing to charge carrier transport, since the portion 222B is not part of the current flow path.

FIG. 2d schematically illustrates a cross sectional view of the fuse 220 as shown in FIG. 2c. As illustrated, the current flow path 205 may be outside of the stress buffer region 222. With respect to process techniques for forming the fuse 220 as shown in FIGS. 2c and 2d, the same criteria may apply as previously explained.

Figure 2E:
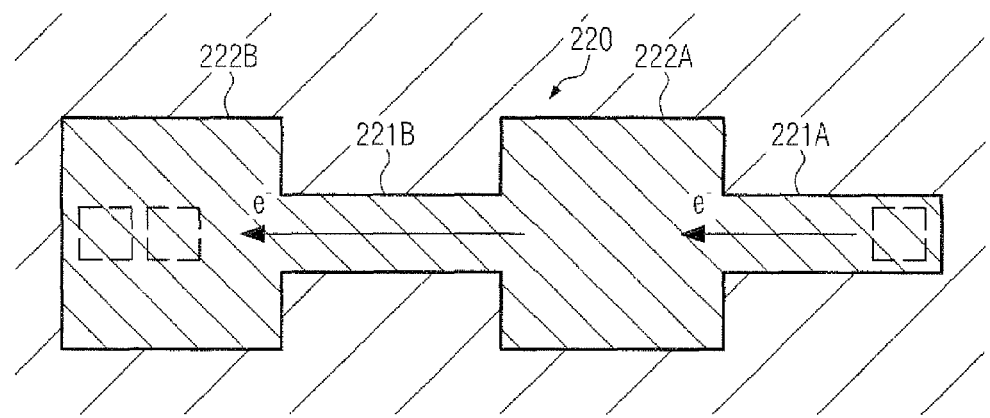
FIG. 2e schematically illustrates a top view of the metal fuse comprising a plurality of fuse bodies and a plurality of stress buffer regions arranged in an alternating manner along the current flow path, according to still further illustrative embodiments.

FIG. 2e schematically illustrates the metal fuse 220 according to further illustrative embodiments in which two or more fuse body regions or portions 221A, 221B and two or more stress buffer regions or portions 222A, 222B may be arranged along the current flow in an alternating manner. Consequently, the number of positions at which a current-induced metal diffusion may be initiated may be multiplied in a highly efficient manner, wherein, in each fuse body portion or region 221A, 221B, an efficient metal depletion may occur due to the efficient stress reduction achieved on the basis of the stress buffer regions 222A, 222B.

Figure 2F:
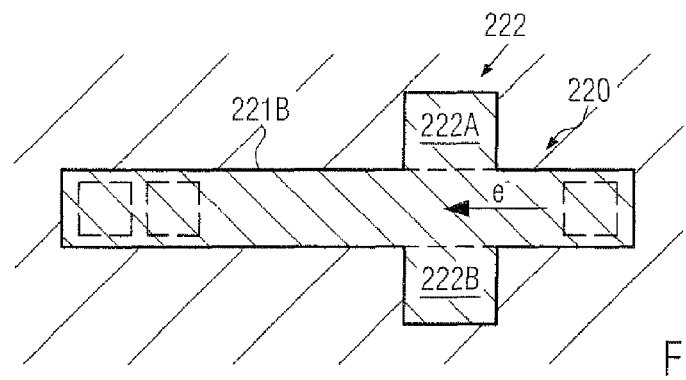
FIGS. 2f-2g schematically illustrate top views of the metal fuse including stress buffer regions outside the current flow path, according to still further illustrative embodiments.

FIG. 2f schematically illustrates a top view of the metal fuse 220 according to a further illustrative embodiment, wherein the stress buffer region 222 may comprise the first and second regions or portions 222A, 222B, which are positioned outside of the current flow path. As illustrated, the portions 222A, 222B are positioned at laterally opposing sides of the fuse body 221, wherein the position of the region 222 along the current flow direction may be selected so as to locally provide an efficient stress reduction.

Figure 2G:
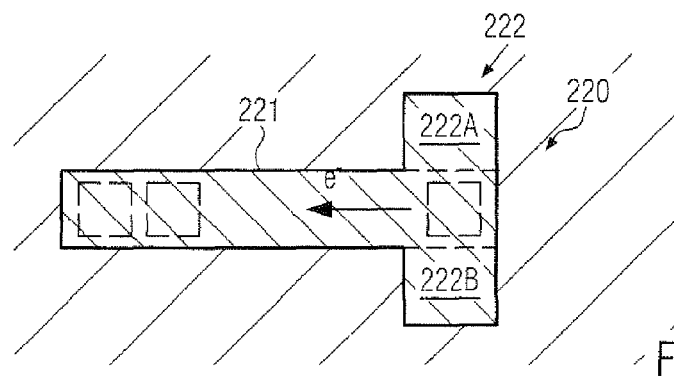

FIG. 2g schematically illustrates the fuse 220 according to a further variation in which the portions 222A, 222B may be positioned in close proximity to the current entry point of the fuse body 221, for instance provided in the form of the via 224C, as previously discussed, when this region may be considered as a stress critical region, in which an efficient stress reduction may result in a very efficient metal diffusion.

It should be appreciated that a plurality of space-efficient layouts and configurations of the metal fuse 220 may be accomplished, as long as the stress buffer region may be provided so as to reduce the overall compressive stress upon programming the fuse 220. Thus, the fuse body 221 may have any appropriate geometric configuration, for instance a plurality of linear portions connected under various angles may be provided, thereby even further enhancing the current crowding at corresponding corners that connect the different linear portions. A corresponding configuration may be considered as a two-dimensional configuration. In other cases, the plurality of line portions and vias may be provided for the fuse body so that an angled configuration may be obtained along the height direction of the metallization system, if considered appropriate, for instance a chain of vias may be connected in series by line portions that are formed in two adjacent metallization layers in an alternating manner. Furthermore, in a three-dimensional configuration, if desired, the fuse 220 may extend across more than two metallization layers.

Figure 2H:
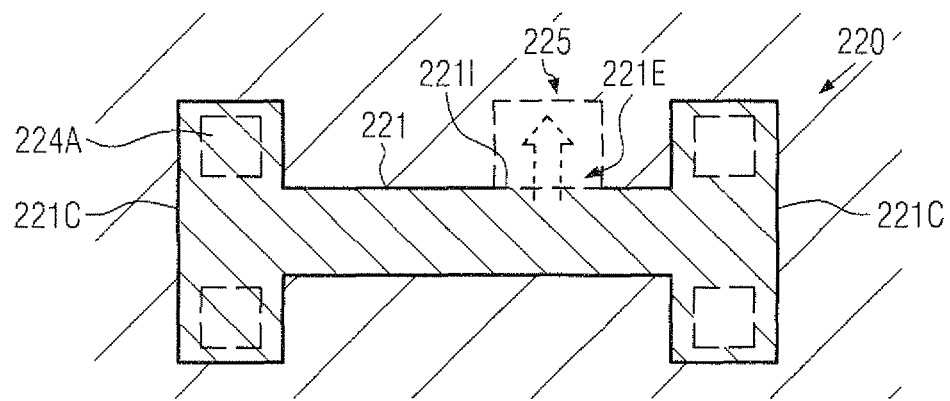
FIGS. 2h-2i schematically illustrate top views of the metal fuse, wherein an extrusion portion may be provided in the fuse body, so as to determine an "exit" point for the metal diffusing due to the electromigration effect in the fuse body, according to illustrative embodiments.

FIG. 2h schematically illustrates a top view of the fuse 220 according to further illustrative embodiments in which an efficient stress reduction may be accomplished by providing a defined volume for metal agglomeration outside of the fuse body. As illustrated, the fuse 220 may comprise the fuse body 221, for instance in the form of a line portion, which may be contacted by appropriate contact areas 221C having an increased width and the like so as to avoid current-induced metal diffusion therein. Moreover, a metal accumulation region 225 may be provided, for instance in the form of a void in a surrounding dielectric material or in the form of the dielectric material itself, for instance by modifying the characteristics thereof, as will be discussed later on in more in detail. Furthermore, the fuse body 221 may comprise an extrusion portion 221E, which may represent an "exit" point for metal material that is to diffuse into the metal accumulation region 225. For example, the extrusion portion 221E may have a weakened interface 221I, obtained, for instance, by reducing or completely omitting a conductive barrier material in a well-defined area of the fuse body 221.

Figure 2I:
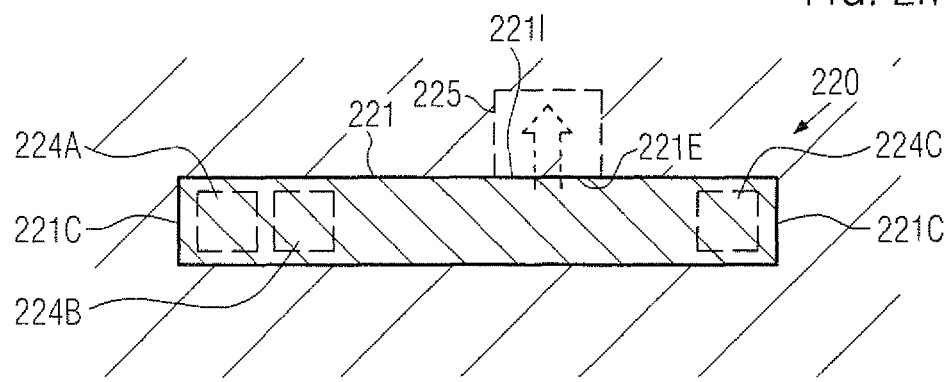

FIG. 2i schematically illustrates the fuse 220 in a substantially elongated configuration, wherein the contact areas 221C may be formed so as to not require an extra width, while nevertheless providing the required conductivity, for instance on the basis of the contact elements 224A, 224B so as to avoid current-induced metal diffusion in at least one the contact areas 221C.

The metal fuse 220 as illustrated in FIGS. 2h and 2i may be formed on the basis of any appropriate process technique, wherein, upon patterning the corresponding trenches in a dielectric material, a mask may be formed so as to avoid a deposition of a barrier material. Thereafter, the mask may be removed and the actual metal material may be filled in, in accordance with any appropriate deposition techniques. In other cases, a conductive barrier material may be locally removed or at least reduced in thickness, for instance by any appropriate etch process performed on the basis of a lithography mask so as to cover the remaining portion of the fuse 220. Moreover, the metal accumulation region 225 may be formed in a dielectric material, such as a low-k dielectric material and the like, by locally modifying the material characteristics, for instance by ion bombardment and the like, thereby reducing, for instance, the dielectric strength and the like. Moreover, a reduced activation energy for current-induced metal diffusion along the interface 221I may be obtained, thereby also contributing to preferred material extrusion at the portion 221E.

Consequently, upon operating the fuse 220, the current-induced metal diffusion may occur in the fuse body 221, wherein the portion 221E may represent the weakest point in the fuse body 221, so that the increasing compressive stress may finally result in metal migration into the region 225, thereby reducing or at least restricting the prevailing compressive stress component in the fuse body 221 and thus providing superior conditions for the further metal diffusion. Consequently, a reliable deterioration of the fuse body 221, with respect to conductivity, may be achieved.

Figure 2J:
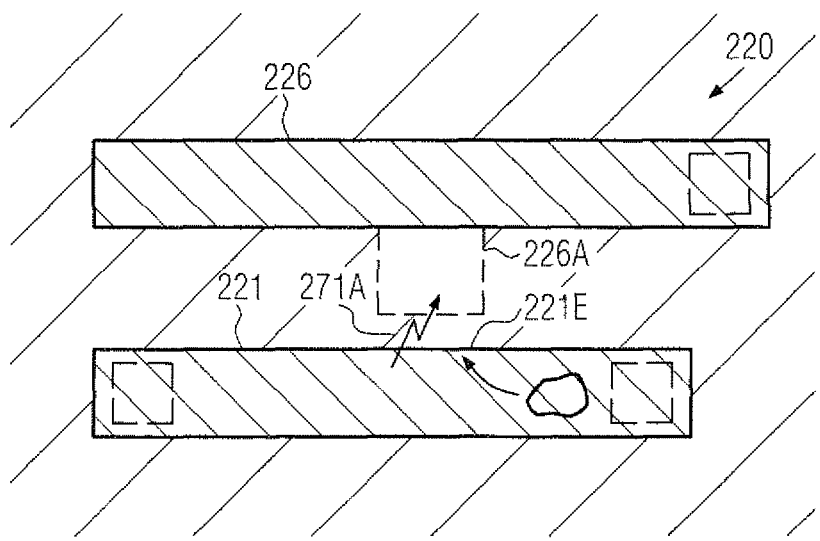
FIG. 2j schematically illustrates a top view of the metal fuse including an "active" mechanism in the form of an extrusion line for initiating metal extrusion at a well-defined location of the fuse body, according to illustrative embodiments.

FIG. 2j schematically illustrates the fuse 220 according to further illustrative embodiments in which an extrusion region 226 may be provided adjacent to the fuse body 221, which may be electrically disconnected from the fuse body 221. Consequently, upon applying a different potential between the extrusion region 226 and the fuse body 221, a controlled modification of a dielectric material 271A may be initiated, for instance as a dielectric breakdown, thereby defining the extrusion portion 221E, through which metal may be efficiently distributed into the adjacent modified dielectric material 271A, which may, thus, act as the metal agglomeration region. In some illustrative embodiments, the extrusion region 226 may have formed thereon an appropriate protrusion 226A, which may thus result in an increased electrical field strength between the region 226 and the fuse body 221, thereby efficiently determining in advance the position of the extrusion portion 221E. Consequently, the compressive stress reducing or limiting effect may be actively initiated by providing the potential difference in a controlled manner.

The fuse 220 comprising the extrusion 226 may be formed on the basis of any well-established process techniques, wherein a corresponding design may be used in order to obtain a required lateral offset of the regions 221 and 226. For example, a lateral offset of 100 nm and significantly less may be achieved, for instance by using the protrusion 226A, which may result in an efficient modification of the dielectric strength, in particular in low-k materials as these materials may generally have a reduced dielectric strength. For example, a dielectric break\down upon programming the fuse 220 may be initiated, wherein a corresponding voltage may be applied to the extrusion region 226 permanently or at least when supplying the programming current pulse.

Figure 2K:
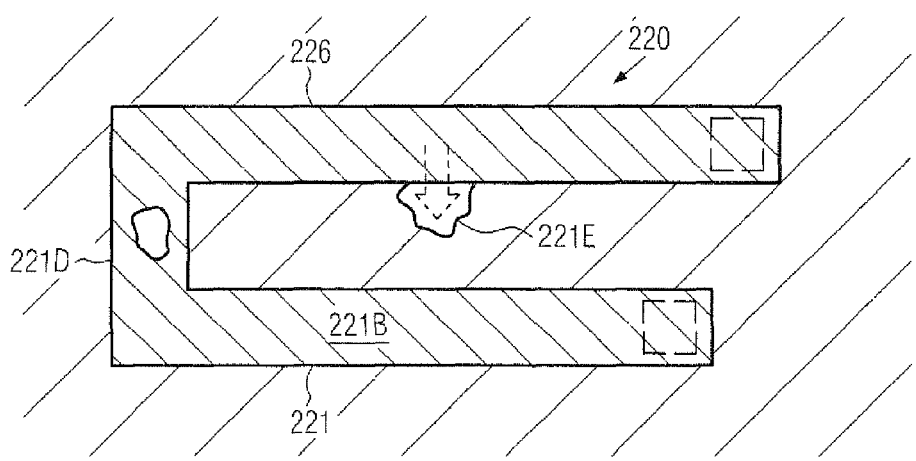
FIG. 2k schematically illustrates a top view of the metal fuse, wherein closely spaced fuse bodies may result in a self-enhancing extrusion effect, according to still other illustrative embodiments.

FIG. 2k schematically illustrates the fuse 220 according to further illustrative embodiments in which the fuse body 221 may be configured so as to comprise two closely spaced line portions, indicated as 221B and 226, that are connected by a portion 221D. One of the line portions 226, 221B may serve as a extrusion region or line, as previously explained, once a current-induced metal diffusion may have resulted in the extrusion of a metal volume into the adjacent dielectric material, as indicated as 221E. Consequently, the metal 221E initially removed from the line 226 may, thus, further promote material extrusion, thereby achieving a self-enhancing effect, which finally results in a highly reliable deterioration of the conductive state of the fuse 220.

Figure 2L:
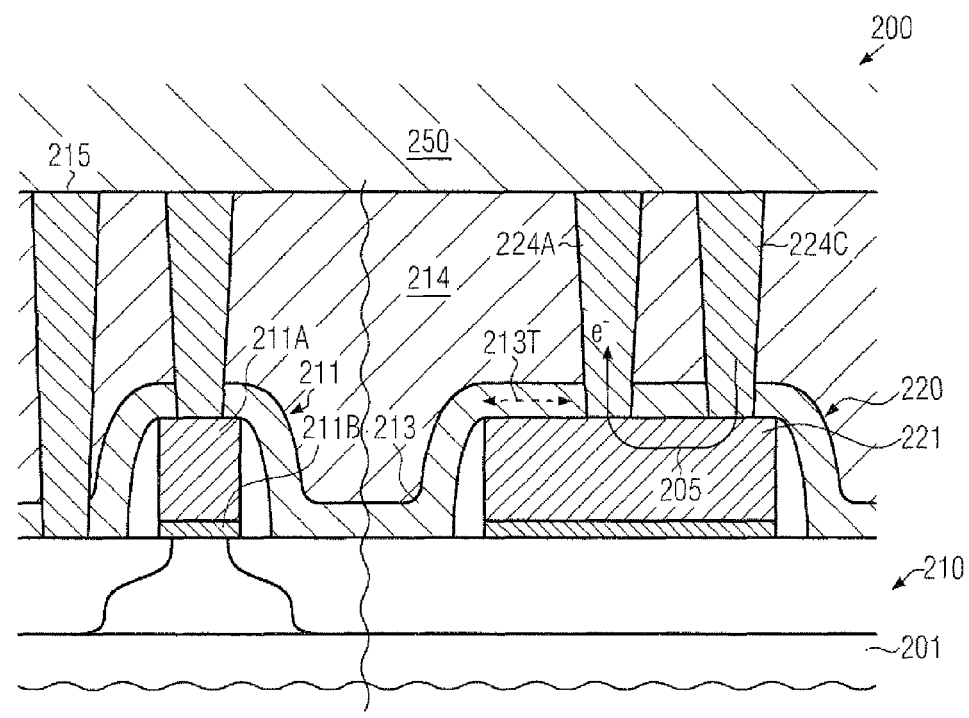
FIG. 2l schematically illustrates a cross-sectional view of the metal fuse according to further illustrative embodiments, in which the fuse body may be formed in the device level based on a complex metal system used for forming high-k metal gate electrode structures.

FIG. 2l schematically illustrates a cross-sectional view of the semiconductor device 200 according to embodiments in which the metal fuse 220, for instance configured according to any of the above-described embodiments, may be implemented in a device level 210 of the device 200. As illustrated, the device level 210 may comprise any appropriate semiconductor material, such as silicon and the like, in and above which circuit elements 211 may be formed, for instance sophisticated field effect transistors, capacitors, resistors and the like. As discussed above, the transistor 211 may comprise a sophisticated gate electrode structure comprising a highly conductive metal 211A, such as aluminum and the like, in combination with a high-k dielectric material 211B. Thus, the metal fuse 220 may comprise at least the metal 211A, possibly in combination with the gate dielectric material 211B, and may have any appropriate configuration, for instance comprising a stress buffer region, a metal agglomeration region, or any combination thereof, as is also previously discussed above. Furthermore, the transistor 211 may be embedded in a dielectric material 214, in which appropriate contact elements 215 may be formed so as to connect to the transistor 211. Similarly, the metal fuse 220 may comprise as a contact area contact elements 224A, 224C so as to establish a desired current flow path 205 within the fuse body 221 of the fuse 220. The dielectric material 214 in combination with the contact elements 215 and 224A, 224C, may represent a contact structure for connecting circuit elements in the device level 210 with the metallization system 250.

Consequently, the metal fuse 220 may be efficiently formed in accordance with process techniques as are required for providing sophisticated high-k metal gate electrode structures based on the materials 211A, 211B, wherein undue area consumption in the device level 210 may be avoided by implementing the additional mechanisms for stress reduction or limitation in the fuse 220, as is also discussed above with reference to FIGS. 2a-2k.

In some illustrative embodiments, as indicated in FIG. 2l, the dielectric material 214 may comprise a material layer 213, which may have, at least above the fuse 220, a high tensile stress component, as indicated by 213T, thereby also efficiently compensating for or at least reducing a compressive stress component which may be created in the fuse body 221 upon programming the fuse 220. For instance, silicon nitride material or many other materials may be deposited with a high internal tensile stress component, which may be controlled by selecting appropriate deposition parameters. Consequently, by applying a high tensile stress component upon depositing the material 213, the initial conditions and also conditions during the entire programming activity may be enhanced due to the permanently induced tensile stress component, which may thus reduce or compensate for the compressive stress, thereby achieving the desired high metal diffusion efficiency. It should be appreciated that, in some illustrative embodiments (not shown), the layer 213 may represent the stress buffer region, when the resulting stress reduction is considered appropriate. In other cases, a corresponding volume of the stress buffer region 222 may be reduced due to the presence of the highly tensilely stressed material 213, thereby achieving a very compact overall configuration of the fuse 220 in the device level 210.

As a result, the present disclosure provides semiconductor devices including metal fuses and methods of operating the same in which efficient mechanisms for reducing or restricting the compressive strain may be implemented, thereby increasing efficiency for degradation in the fuse body for a given overall volume required in the metallization system or in the device level of the semiconductor device. The stress reduction or limitation may be achieved by providing a stress buffer region and/or providing a well-defined metal extrusion, for instance using an active mechanism for initiating metal extrusion based on an extrusion line.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
an electrically programmable fuse comprising:
a fuse body comprising a metal, said fuse body being configured to enable current-induced metal diffusion upon establishing a programming current in said fuse body;
a plurality of contact regions connecting to said fuse body, said contact regions defining a current flow path in said fuse body between said contact regions; and
a stress buffer region in direct mechanical contact with said fuse body, wherein said stress buffer region is positioned outside of said current flow path.

2. The semiconductor device of claim 1, further comprising a metallization system formed above a semiconductor layer, wherein said fuse is formed in said metallization system.

3. The semiconductor device of claim 1, further comprising a device level formed in and above a semiconductor layer, wherein at least said fuse body and said stress buffer region are formed in said device level.

4. The semiconductor device of claim 1, wherein said fuse body has a first cross-sectional area perpendicular to a current flow direction of said current flow path and said stress buffer region has a second cross-sectional area that is greater than said first cross-sectional area.

5. The semiconductor device of claim 1, wherein said fuse body has a first cross-sectional area perpendicular to a current flow direction of said current flow path and said stress buffer region has a second cross-sectional area that is the same as said first cross-sectional area.

6. The semiconductor device of claim 1, further comprising a tensile-stressed dielectric material that is mechanically connected to at least a portion of said stress buffer region.

7. The semiconductor device of claim 1, wherein said stress buffer region is adapted to substantially avoid generation of compressive stress within said stress buffer region during said current-induced metal diffusion.

8. A semiconductor device, comprising:
an electrically programmable fuse comprising:
a fuse comprising a metal line portion and a stress buffer region that is in direct mechanical contact with said metal line portion; and
a plurality of laterally spaced apart contact regions connecting to said metal line portion of said fuse, wherein said spaced apart contact regions and said metal line portion positioned between said spaced apart contact regions define a current flow path in said fuse so as to enable current-induced metal diffusion in one of said metal line portion or said contact regions upon establishing a programming current in said fuse and wherein said stress buffer region is positioned outside of said current flow path.

9. The semiconductor device of claim 8, further comprising a metallization system formed above a semiconductor layer, wherein said fuse is formed in said metallization system.

10. The semiconductor device of claim 8, further comprising a device level formed in and above a semiconductor layer, wherein at least said metal line portion and said stress buffer region are formed in said device level.

11. The semiconductor device of claim 8, wherein said metal line portion has a first cross-sectional area perpendicular to a current flow direction of said current flow path and said stress buffer region has a second cross-sectional area that is greater than said first cross-sectional area.

12. The semiconductor device of claim 8, wherein said metal line portion has a first cross-sectional area perpendicular to a current flow direction of said current flow path and said stress buffer region has a second cross-sectional area that is the same as said first cross-sectional area.

13. The semiconductor device of claim 8, further comprising a tensile-stressed dielectric material that is mechanically connected to at least a portion of said stress buffer region.

14. The semiconductor device of claim 8, wherein said stress buffer region is adapted to substantially avoid generation of compressive stress within said stress buffer region during said current-induced metal diffusion.

15. A semiconductor device, comprising:
   an electrically programmable fuse comprising:
      an integral fuse body comprising a metal line portion and a stress buffer region that is integrally formed with said metal line portion; and
      a plurality of laterally spaced apart contact regions connecting to said metal line portion of said fuse body, wherein said spaced apart contact regions and said metal line portion positioned between said spaced apart contact regions define a current flow path in said fuse body so as to enable current-induced metal diffusion in one of said metal line portion or said contact regions upon establishing a programming current in said fuse, said stress buffer region is positioned outside of said current flow path and wherein said metal line portion has a first cross-sectional area perpendicular to a current flow direction of said current flow path and said stress buffer region has a second cross-sectional area that is greater than said first cross-sectional area.

16. The semiconductor device of claim 15, wherein said stress buffer region is adapted to substantially avoid generation of compressive stress within said stress buffer region during said current-induced metal diffusion.

17. A semiconductor device, comprising:
   an electrically programmable fuse comprising:
      an integral fuse body comprising a metal line portion and a stress buffer region that is integrally formed with said metal line portion; and
      a plurality of laterally spaced apart contact regions connecting to said metal line portion of said fuse body, wherein said spaced apart contact regions and said metal line portion positioned between said spaced apart contact regions define a current flow path in said fuse body so as to enable current-induced metal diffusion in one of said metal line portion or said contact regions upon establishing a programming current in said fuse, said stress buffer region is positioned outside of said current flow path and wherein said metal line portion has a first cross-sectional area perpendicular to a current flow direction of said current flow path and said stress buffer region has a second cross-sectional area that is the same as said first cross-sectional area.

18. The semiconductor device of claim 17, wherein said stress buffer region is adapted to substantially avoid generation of compressive stress within said stress buffer region during said current-induced metal diffusion.

* * * * *